United States Patent
Aldinger et al.

(10) Patent No.: US 6,254,675 B1
(45) Date of Patent: Jul. 3, 2001

(54) PRODUCTION OF EPITACTIC GAN LAYERS ON SUBSTRATES

(75) Inventors: Fritz Aldinger, Leinfelden-Echterdingen (DE); Fred Lange, Santa Barbara, CA (US); Manfred Puchinger, Stuttgart (DE); Thomas Wagner, Nürtingen (DE); Joachim Bill, Stuttgart (DE); Dieter Rodewald, Bad Essen-Linne (DE)

(73) Assignee: Max-Planck-Gesellschaft zur Forderung der Wissenschaften E.V., Munich (DE)

( * ) Notice: Subject to any disclaimer, the term of this patent is extended or adjusted under 35 U.S.C. 154(b) by 0 days.

(21) Appl. No.: 09/605,327

(22) Filed: Jun. 27, 2000

(30) Foreign Application Priority Data

Jun. 28, 1999 (DE) .................................. 199 29 591

(51) Int. Cl.$^7$ ...................................................... C30B 25/02
(52) U.S. Cl. ............................. 117/89; 117/104; 117/952
(58) Field of Search ............................. 117/952, 89, 104; 252/62.36 A

(56) References Cited

U.S. PATENT DOCUMENTS

| | | | | |
|---|---|---|---|---|
| 5,433,169 | * | 7/1995 | Nakamura | 117/952 |
| 5,923,950 | * | 7/1999 | Ishibashi et al. | 117/952 |
| 5,989,338 | * | 11/1999 | DeBoer et al. | 117/952 |
| 5,997,639 | * | 12/1999 | Iyer | 117/952 |
| 6,146,457 | * | 11/2000 | Solomon | 117/952 |
| 6,176,925 | * | 1/2001 | Solomon et al. | 117/952 |

* cited by examiner

Primary Examiner—Robert Kunemund
(74) Attorney, Agent, or Firm—Fulbright & Jaworski, LLP

(57) ABSTRACT

The present invention relates to a process for the application of an epitactic GaN layer to a substrate by pyrolysis of precursor compounds.

15 Claims, 4 Drawing Sheets

PRODUCTION OF EPITACTIC GAN LAYERS ON SUBSTRATES

The present invention relates to a process for the application of an epitactic GaN layer to a substrate by pyrolysis of precursor compounds.

Owing to the development of blue light emitting diodes (LEDs) and laser diodes, gallium nitride (GaN) has recently increased in importance. Hexagonal GaN has a direct band gap of about 3.4 eV (Lacklison et al., J. Appl. Phys. 78 (1995), 1838), enabling it to be employed very well in short-wave optical devices (Nakamura and Fasol, The Blue Laser Diode: GaN-based Light Emitters and Lasers, Berlin, Springer Verlag, 1997; Pearton and Kuo, MRS Bulletin 22 (1997), 17).

At present, single-crystal GaN layers for opto-electronic components are produced by deposition of atoms or molecules from the gas phase (chemical vapor deposition, CVD) or by molecular beam epitaxy (MBE), as described in Lin et al. (J. Appl. Phys. 74 (1993), 5038) and Lee et al. (J. Crystal Growth 182 (1997), 11). In the MBE process, metallic gallium and molecular nitrogen are generally used as starting materials. In most CVD processes, by contrast, volatile organo-metallic precursor compounds, such as, for example, trimethylgallium or triethylgallium, and ammonia are employed. The disadvantages of these processes are that they are complex and expensive.

The object on which the invention is based was thus to provide a simpler and economically advantageous process for the production of epitactic GaN layers on substrates.

Surprisingly, it has been found that epitactic GaN layers can be produced on substrates by applying carbodiimide-containing precursor compounds followed by pyrolysis. After the application, the precursor compounds are preferably distributed uniformly, for example by spin coating, dip coating or by spray coating. The thickness of the resultant layer can be varied depending on the rotational speed during spin coating and the viscosity of the precursor solution. Under ammonia as reactive gas, the precursor film can then be converted into crystalline GaN at temperatures of preferably about 900° C. By introducing doping elements into the precursor solution, the composition of the GaN layer can likewise be influenced.

The present invention thus relates to a process for the application of an epitactic GaN layer to a substrate, in which a gallium carbodiimide-containing precursor compound is applied to the substrate and converted by pyrolysis into crystalline GaN, in particular into GaN having a hexagonal or cubic crystal structure.

The precursor compound is obtainable by reaction of a gallium salt with a carbodiimide-containing organic compound under suitable reaction conditions under which gallium atoms can form a bond to carbodiimide. The gallium salt employed is preferably a gallium halide, particularly preferably $GaCl_3$. The resultant precursor compound contains gallium and carbodiimide advantageously in a molar ratio of from 1:0.5 to 1:3, in particular in a molar ratio of from 1:0.8–1.2, for example of about 1:1.

The precursor compound can have a structure of the general formula (I):

(I)

where
- R is an organic or inorganic radical, preferably a silyl-containing radical, which may furthermore contain alkyl, alkenyl or aryl groups, halogen and/or hydrogen,
- A is an anion, preferably a halide ion, and the ratio w:x:y:z is in the range from 1:0.5–3:0.01–1:0.5–1.5 and preferably from 1:0.8–1.2:0.01–0.3:0.8–1.2.

Particular preference is given to the gallium precursor compounds prepared by reaction of gallium halides with a compound of the formula (II)

(II)

in which
- R' are each, independently of one another, an organic or inorganic radical, for example a $C_1$–$C_3$ alkyl or alkenyl group, preferably a methyl group, an aryl group, a halogen or H.

On reaction of the compound (II) with the gallium halide, the reaction products formed are a volatile trialkylhalosilane and the polymeric crosslinked gallium carbodiimide-containing precursor compound. After the preparation, the crosslinked polymer remains essentially dissolved in the compound (II) and, if necessary, further solvent. The precursor compound can be isolated as a solid by removal of volatile substances, for example under reduced pressure.

Suitable substrates for process according to the invention are basically any desired substrates which withstand the temperatures prevailing during the pyrolysis treatment. It is advantageous to use substrates which have similar coefficients of thermal expansion to cubic or hexagonal GaN. Preference is given to substrates comprising elements from main groups III to VI and sub-groups IV to VI of the Periodic Table of the Elements or compounds containing such elements. Preferred examples of substrates are elements or compounds having metallic or semiconducting properties, for example Si and GaAs. Further preferred examples are substrates having graphite surfaces or ceramic surfaces, for example SiC, $Al_2O_3$, $Si_3N_4$, TiC or TiN. The particularly preferred substrate is $\alpha$-$Al_2O_3$, in particular $\alpha$-$Al_2O_3$—R.

Particularly suitable for the deposition of heteroepitactic $\alpha$-GaN are $\alpha$-$Al_2O_3$ (0001), $\alpha$-$Al_2O_3$ (01-12), $\alpha$-$Al_2O_3$ (11-20), $\alpha$-$Al_2O_3$ (10-10), and 6H—SiC (0001). For cubic GaN ($\beta$-GaN), GaAs (001) as well as Si (001) and Si (111) substrates are of particular importance.

The substrate to be coated is brought into contact with a solution or suspension of the precursor compound or with the precursor compound itself if this is liquid, a layer of the precursor compound being deposited on the surface of the substrate. This layer of the precursor compound is then preferably distributed as uniformly as possible over the substrate surface to be coated. This distribution can be carried out by spin coating, dip coating or spraying. Application by spin coating is described in detail in the examples. In the case of dip coating, the substrate is preferably immersed in the precursor and then removed at a uniform, defined rate, the substrate being uniformly coated with the exception of the lower edge. In the case of spray coating, the precursor is atomized, and the substrate is held in the spray cone or spray mist. It is also conceivable to apply the precursor by spreading, for example with a brush.

The preparation of the precursor compounds and in particular the application of the precursor compound to the substrate preferably take place under an inert atmosphere, for example a noble-gas atmosphere, such as, for example, argon.

The pyrolysis treatment of the precursor compound applied to the substrate surface as a coating is carried out, in particular, by heating to a temperature of at least 600° C., preferably of about 900° C., under a reactive atmosphere containing ammonia. The ammonia partial pressure is preferably from $10^4$ to $10^6$ Pa, particularly preferably about $10^5$ Pa.

An essential advantage of the process according to the invention consists in that the precursor compound can comprise further doping elements, such as Si, Ge and/or Mg. If the precursor compound is prepared by reaction of gallium halides with compounds of the formula (II), silicon is always present in the precursor and is also incorporated into the resultant GaN layer in small amounts (less than 1 atom-%). Further silicon and other doping elements, such as Mg or Ge, can be introduced by additions to the precursor, for example via elemental halides or auxiliary polymers. There are basically no restrictions with respect to the elements which are suitable. The doping elements are preferably employed in a proportion of up to 10 atom-%, based on the amount of gallium present in the precursor compound.

The thickness of the epitactic GaN layer can be varied within broad limits, for example by selecting precursor compounds of different viscosity and/or by repeating the coating operation one or more times until a layer having the respective desired thickness is built up. The thickness preferably extends from individual atom layers up to 10 μm. Thicknesses of up to 1 μm are particularly preferred.

Finally, the present invention also relates to an article obtainable by the process according to the invention having a surface which is at least partly coated with an epitactic GaN layer. The GaN layer preferably contains facets, where the shape of the facets which occur is dependent on the substrate used. Thus, GaN facets on the R plane of $\alpha$-$Al_2O_3$ have a pyramidal form with a mean height of from 30 to 70 nm, for example about 50 nm, and a mean base length of from 100 to 150 nm. GaN layers having a similar facet morphology can be produced by organometallic vapor-phase epitaxy (Sasaki and Zembutsu, J. Appl. Phys. 61 (1987), 2533) and plasma-supported molecular beam epitaxy (Eddy et al., J. Appl. Phys. 73 (1993), 448).

A great potential of the GaN layers produced by polymer pyrolysis consists in their use as buffer layer for the production of thick GaN layers (>1 μm) by CVD, MBE and related methods. The buffer layer improves the crystallinity of GaN layers deposited on top, in particular good electrical properties are achieved, for example a high Hall mobility of up to 3000 $cm^2$/Vs at 70 K.[−] Typical buffer layer thicknesses are about 50 nm and can thus easily be produced by polymer pyrolysis. Furthermore, the GaN layers produced by polymer pyrolysis can also be employed in semiconductor components, such as light emitting diodes.

The invention will furthermore be explained by the following figures and examples, in which:

EXAMPLES

1. Methods
1.1 Preparation of Precursor Compounds

A precursor solution was prepared by stirring 3.7 g (21 mmol) of gallium chloride ($GaCl_3$) with 120 ml (530 mmol) of bis(trimethylsilyl)carbodiimide $(Me_3Si)NCN(SiMe_3)$ for 3 days at room temperature. The resultant solution was refluxed at about 170° C. for 9 hours. During this period, the trimethylsilyl groups were substituted by Ga atoms, which are able to bind up to 3 carbodiimide groups. $Me_3SiCl$ is also formed. After filtration, a yellow solution is obtained which contains $Ga_w(NCN)_x(SiMe_3)_yCl_z$ as precursor compound. After evaporation of the excess solvent, the ratio w:x:y:z was determined as 1.00:1.05:0.20 1.05.

1.2 Production of GaN Films

Polished $\alpha$-$Al_2O_3$—R and $\alpha$-$Al_2O_3$-C substrates (CrysTec, Berlin, Germany) were mounted on a spin-coating apparatus. 2 to 3 drops of the precursor solution were placed on the substrate surface in an argon atmosphere. The disk was subsequently rotated at high speed (see Table 1) for about 30 seconds.

TABLE 1

| Sample | Sapphire orientation | Spin speed (rpm) |
|---|---|---|
| 1 | R plane | 2000/2000/2000 |
| 2 | C plane | 6000/4000/4000 |

The samples was subsequently introduced into a sealed Schlenk flask and placed in a tubular furnace. After flushing with ammonia gas, a constant stream of ammonia was established within the Schlenk flask (about 1 to 5 $cm^3$/s, $10^5$ Pa). The furnace was heated from room temperature (RT) to 100° C. at 3.5 K/min and from 100° C. to 900° C. at 5 K/min. After a hold time of 6 min, the furnace was cooled to RT at 4.3 K/min. In order to produce thicker films, the above process was carried out three times successively in the absence of air.

1.3 Characterization

The structure of the chemical composition of the films was characterized by X-ray diffraction (XRD) (Siemens D 500), scanning electron microscopy (SEM) (Zeiss DSM 982 Gemini) and conventional and analytical transmission electron microscopy (Jeol JEM 200 CX; Jeol JEM 2000⁻ FX, VG HB501). Samples for cross-section transmission electron microscopy (TEM) were prepared as described by Strecker et al. (Prakt. Metallogr. 30 (1993), 482).

2. Results

Figure 1:
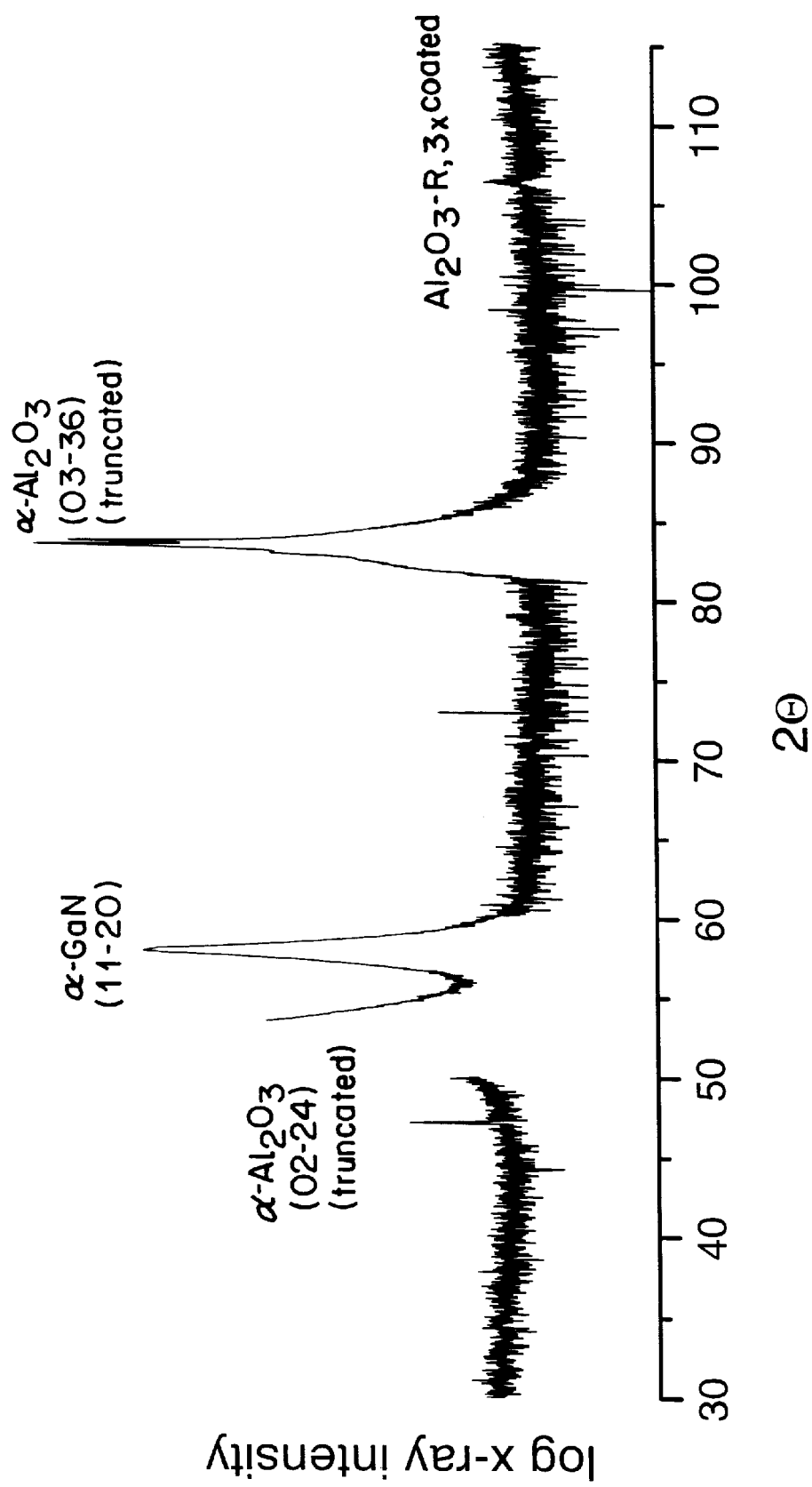
FIG. 1 shows X-ray diffraction studies on GaN films produced by pyrolysis of precursor compounds on $Al_2O_3$-R substrates.

After the pyrolysis, XRD $\theta$–$2\theta$ scans were carried out in order to determine the film structures. The results for a GaN film on an $Al_2O_3$—R surface are shown in FIG. 1. The XRD pattern of the sample shows a strong reflection at 57.9°, which can be assigned to $\alpha$-GaN (11-20). No other diffraction peaks were found from the film.

Figure 2:
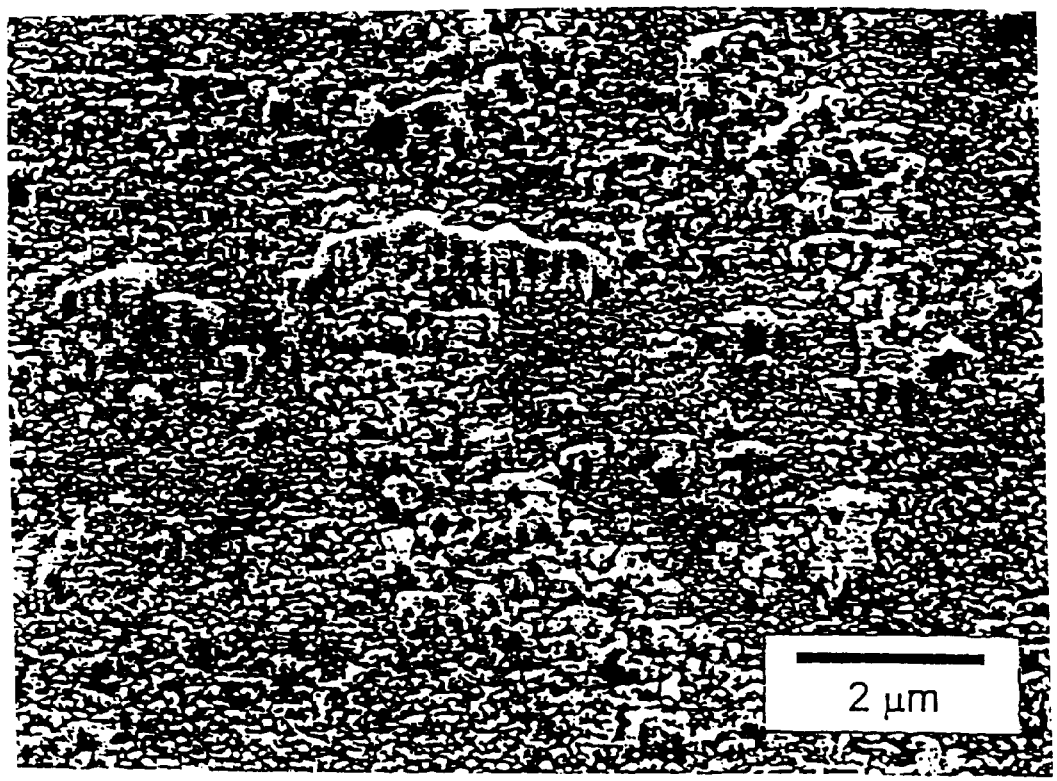
FIG. 2 shows the scanning electron photomicrograph of the surface of an $Al_2O_3$-R substrate coated with a GaN layer produced by the process according to the invention.

An SEM photomicrograph of a multi-coated substrate is shown in FIG. 2. It can be seen that the surface morphology is inhomogeneous. Strongly faceted regions (diameter of each facet 50 to 300 nm) can be observed. In addition, structures of considerably smaller diameter (about 20 nm) occur. Between the faceted regions and the more finely structured regions, both gradual and abrupt changes in the facet size are evident.

Figure 3A:
FIG. 3 shows a transmission electron photomicrograph in cross section (a) and a selective area diffraction (SAD) pattern (b) of a GaN-coated $\alpha$-$Al_2O_3$—R substrate with zone axes $\alpha$-$Al_2O_3$(-2110) and $\alpha$-GaN(1–100)
Figure 3B:
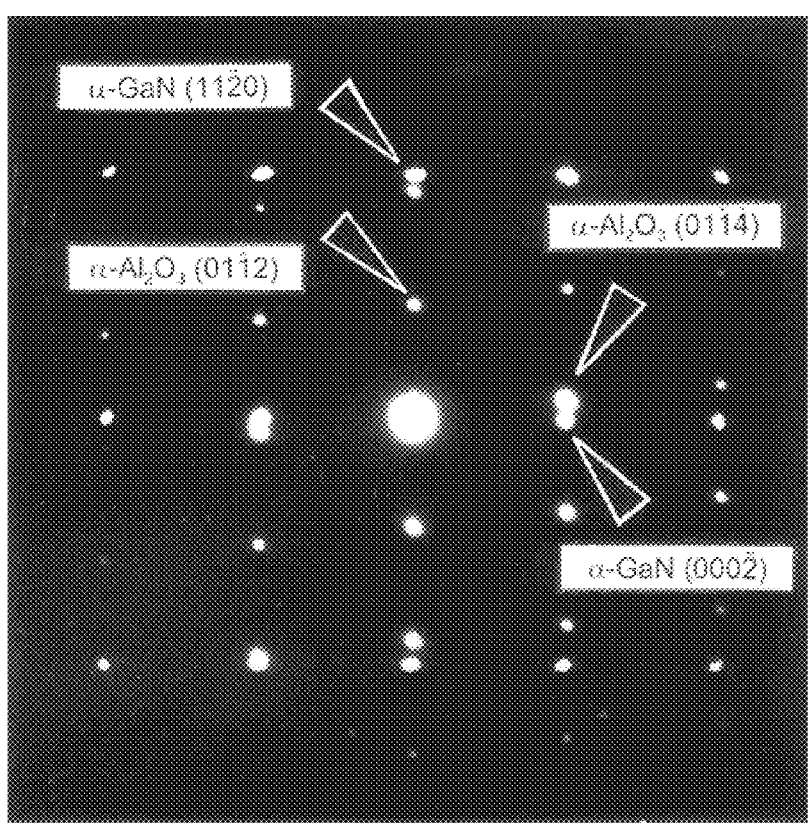

FIG. 3 shows a brightfield TEM picture of the GaN film and of the $\alpha$-$Al_2O_3$ substrate. The electron beam was incident along the [2-1-10]$\alpha$-$Al_2O_3$ direction. An arrangement of regularly shaped $\alpha$-GaN facets covers the substrate. The facets have a pyramidal form with a mean height of about 50 nm and a mean base length of from 100 to 150 nm. As was determined by selective area diffraction (SAD) studies, all structures are epitactic with the orientation relationship (OR I):

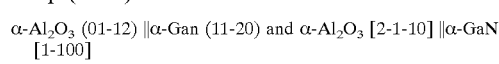

The same orientation relationship is found if GaN films are produced on $Al_2O_3$—R substrates by other methods, such as MBE and CVD (Melton et al., J. Crystal Growth 178 (1997), 168; Lei et al., J. Appl. Phys. 74 (1993), 4430, and Metzger et al., Phys. Stat. Sol. B 193 (1996), 391).

Figure 4:
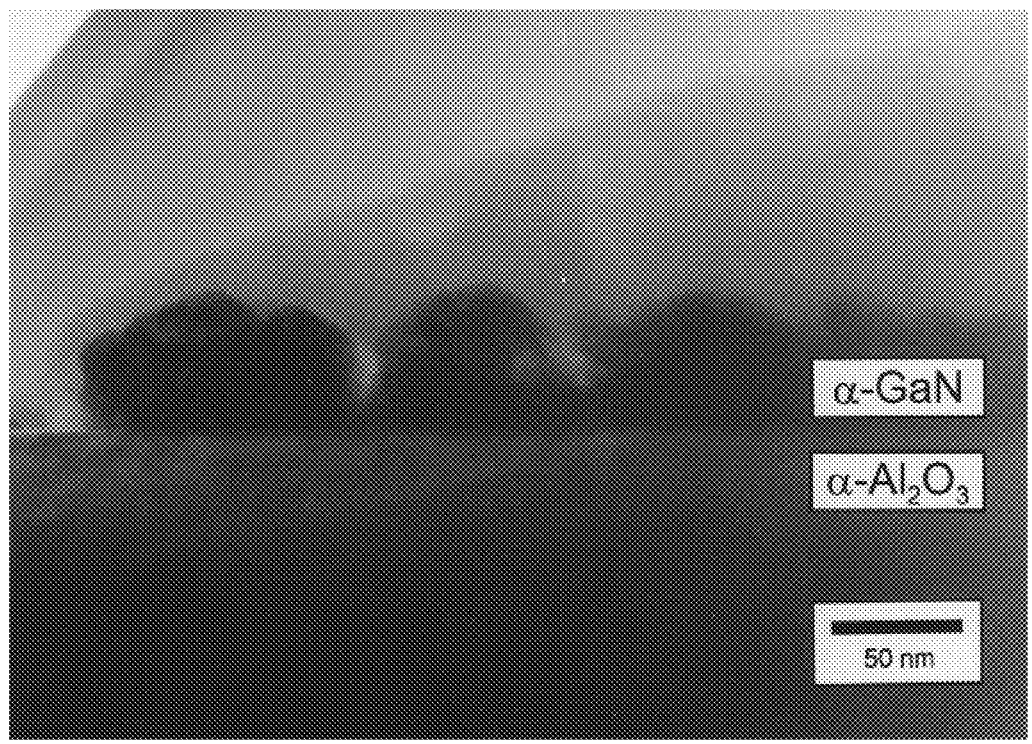
FIG. 4 shows a transmission photomicrograph of a GaN-coated $\alpha$-$Al_2O_3$—R substrate with zone axes $\alpha$-$Al_2O_3$(0111) and $\alpha$-GaN(0001).

FIG. 4 shows a brightfield TEM micrograph of the same region along the [0-111] $\alpha$-$Al_2O_3$ direction. No pyramidal forms, but instead symmetrical structures with a similarity to half hexagons are found. The corresponding SAD pattern again gives the epitactic orientation relationship OR I.

In order to determine the chemical composition of the film, EELS (electron energy loss spectroscopy) measurements were carried out on a relatively thin film (produced by a single coating step) in a scanning transmission electron microscope (STEM). The electron beam was incident on the center of a 50 nm wide pyramid (as shown in FIG. 3). An area of 3×4 nm was studied. The results of the chemical analysis are shown in Table 2.

TABLE 2

| Element | Proportion (at-%) | Deviation (at-%) |
|---|---|---|
| Ga | 46.0 | ±6.2 |
| N | 48.0 | ±6.5 |
| O | 5.6 | ±1.0 |
| others each | <1 | ±1.0 |

The atomic concentrations of Ga and N were virtually identical. In addition, only contamination by oxygen was detected. The measured atomic concentration of oxygen was about 6%. However, this value contains the oxygen originating from surface oxidation of the TEM sample, and consequently the actual oxygen concentration in the film is presumed to be considerably lower.

What is claimed is:

1. A process for the application of an epitactic GaN layer to a substrate comprising the steps of (a) applying a gallium carbodiimide-containing precursor compound to the substrate and (b) converting said gallium carbodiimide-containing precursor into crystalline GaN by pyrolysis.

2. The process of claim 1, wherein the precursor compound contains gallium and carbodiimide in a molar ratio of from 1:0.5 to 1:3.

3. The process of claim 2, wherein the precursor compound has a structure of the general formula (I):

$$Ga_w(NCN)_x(R)_yA_z \qquad (I)$$

wherein R is an organic or inorganic radical, wherein A is an anion, and wherein the ration of w, x, y and z is in the range of 1:0.5–3.0:0.01–1.00:0.5–1.5.

4. The process of claim 3 wherein A is a halide ion.

5. The process of claim 1 wherein the substrate is selected from the group consisting of a ceramic substrate and a metallic substrate.

6. The process of claim 5 wherein the substrate is $\alpha$-$Al_2O_3$.

7. The process of claim 6 wherein the substrate is $\alpha$-$Al_2O_3$—R.

8. The process of claim 1 wherein the precursor compound is applied to the substrate as a liquid or solution and is subsequently distributed over the substrate surface to be coated.

9. The process of claim 8 comprising distributing said precursor by spin coating.

10. The process of claim 1 comprising applying said precursor compound to the substrate under an inert atmosphere.

11. The process of claim 1 comprising perfoming the pyrolysis under an ammonia atmosphere at a temperature of at least 600° C.

12. The process of claim 1 wherein the precursor compound comprises at least one element selected from the group consisting of Si, Ge and Mg.

13. The process of claim 1 comprising repeating the coating one or more times until a layer having a desired thickness is built up.

14. An article obtained by the process of claim 1 wherein said article has a surface which has been at least partly coated with an epitactic GaN layer.

15. The article of claim 14 comprising at least one further GaN layer deposited on top of the epitactic GaN layer.

* * * * *